US006967117B2

(12) United States Patent
Horng et al.

(10) Patent No.: US 6,967,117 B2
(45) Date of Patent: Nov. 22, 2005

(54) METHOD FOR PRODUCING HIGH BRIGHTNESS LED

(75) Inventors: Ray-Hua Horng, Taichung (TW); Tung-Hsing Wu, Taichung (TW); Shao-Hua Huang, Ping-Chen (TW)

(73) Assignee: National Chung-Hsing University, Taichung (TW)

( * ) Notice: Subject to any disclaimer, the term of this patent is extended or adjusted under 35 U.S.C. 154(b) by 0 days.

(21) Appl. No.: 10/892,043

(22) Filed: Jul. 14, 2004

(65) Prior Publication Data

US 2004/0259281 A1 Dec. 23, 2004

Related U.S. Application Data

(62) Division of application No. 10/336,568, filed on Jan. 2, 2003.

(51) Int. Cl.[7] .............................................. H01L 21/00
(52) U.S. Cl. .......................... 438/22; 438/23; 438/24; 438/25; 438/29; 438/30; 438/46
(58) Field of Search .............................. 438/22–25, 29, 438/30, 46, 47

(56) References Cited

U.S. PATENT DOCUMENTS

2003/0143772 A1 * 7/2003 Chen ........................... 438/47

* cited by examiner

Primary Examiner—Hsien-Ming Lee
(74) Attorney, Agent, or Firm—Charles E. Baxley (57) ABSTRACT

The present invention discloses a method for producing a high brightness LED (light emitting diode). The method primarily comprises steps of: a) providing a temporary substrate for epitaxy; b) forming LED epitaxial layers on said temporary substrate, wherein said LED epitaxial layers with pn junction; c) providing a permanent substrate; d) forming a layered structure between said permanent substrate and said LED epitaxial layers, wherein said layered structure has properties of reflection, adhesion, diffusion barrier and buffer; and e) forming a first electrode and a second electrode on proper position to supply enough energy for said LED epitaxial layers. The LED manufactured in accordance with the present invention can exhibit high brightness and excellent mechanical strength during manufacturing.

3 Claims, 7 Drawing Sheets

METHOD FOR PRODUCING HIGH BRIGHTNESS LED

CROSS REFERENCE

The present Application is a Division of co-pending U.S. application Ser. No. 10/336,568 by the same inventors filed on Jan. 2, 2003.

BACKGROUND OF THE INVENTION

1. Field of the Invention

The present invention relates to a method for producing an LED (light emitting diode), and more particularly to a method for producing a high brightness LED, in which excellent mechanical strength for manufacturing can be exhibited.

2. Related Prior Art

Currently, how to promote the brightness or illuminence is a significant issue for developing LED (light emitting diode). Therefore, many studies and developments are being made by researchers and industries.

As one of the most useful substrates for manufacturing LED, GaAs is still not satisfying enough in emitting efficiency, because partial wavelength will be absorbed. R.O.C. Pat. No. 385557, 391067 and 332344 mentioned solutions of this problem by forming epitaxial films with functions of conduction or reflection on the substrate. However, such design is still not satisfying for achieving high brightness.

U.S. Pat. No. 5,376,580 mentioned another solution, in which the GaAs substrate is removed after a transparent GaP substrate is bonded to the LED epitaxial layers formed on the GaAs substrate. In this method, an epitaxial layer of 60–70 $\mu$m needs to be processed, and the alignment with crystal axes of the GaP substrates is difficult during the wafer bonding process. On the other hand, the thermal treatment for a long time may influence luminous effect of the LED with p-n or n-p junction.

R.O.C. Pat. No. 415116 also provided a structure, in which a reflective layer and an adhesion layer are formed between the LED epitaxial layers and the conductive substrate. While such design facilitates brightness of the LED, the following problems exist:

1) The substrate tends to be damaged caused by thermal stress due to different heat transfer coefficients and different thermal expansion coefficients between the layers. For example, the heat transfer coefficient of silicon triples that of GaAs, but the thermal expansion coefficient of silicon is less than that of GaAs (Si: $2.6 \times 10^{-6}$/K, GaAs: $5.7 \times 10^{-6}$/K). Therefore, the Si substrate or GaAs or both may be broken during thermal process.

2) Reflectivity of the reflective layer or characteristic of the light emitting diode may regress because of mutual diffusion between the layers and the substrate.

Therefore, it is desirable to provide an improved LED structure to mitigate and/or obviate the aforementioned problems.

SUMMARY OF THE INVENTION

An object of the present invention is to provide a method for producing a high brightness LED, so that mechanical strength of wafers can be improved and the productivity is thus promoted.

The method for producing the high brightness LED primarily includes step of: a) providing a temporary substrate for epitaxy; b) forming LED epitaxial layers on the temporary substrate, wherein the LED epitaxial layers with pn junction; c) providing a permanent substrate; d) forming a layered structure between the permanent substrate and the LED epitaxial layers, wherein the layered structure has properties of reflection, adhesion, diffusion barrier and buffer; and e) forming a first electrode and a second electrode on proper position to supply enough energy for the LED epitaxial layers.

In the above step d), the layered structure can include a reflective layer, a diffusion barrier and a buffer layer, which can be formed on one or both of the LED epitaxial layers and the permanent substrate in an arbitrary order, and then the epitaxial layers and the permanent substrate are associated by wafer bonding. For example, (1) after the buffer layer and the reflective layer are formed on the LED epitaxial layers, and the diffusion barrier is formed on the permanent substrate, the two parts are associated by wafer bonding; (2) after the reflective layer is formed on the LED epitaxial layers, and the buffer layer and the diffusion barrier are sequentially formed on the permanent substrate, the two parts are associated by wafer bonding; (3) after the diffusion barrier, the buffer layer and the reflective layer are sequentially formed on the permanent substrate, the two parts are associated by wafer bonding.

More detailed description about the present invention will be present in the following embodiments accompanying with drawings.

DETAILED DESCRIPTION OF THE PREFERRED EMBODIMENTS

Figure 1:
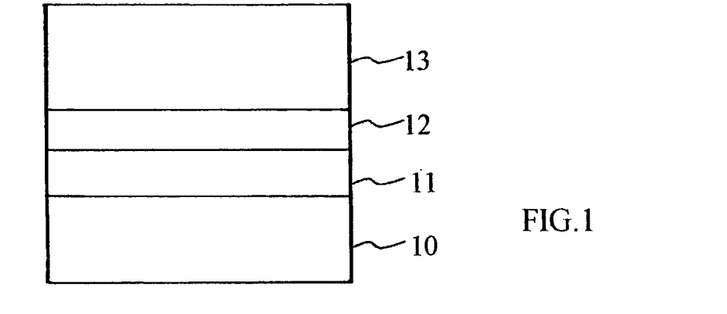
FIG. 1 shows the epitaxial layer with multiple cladding layers.

Referring to FIG. 1, epitaxial layers with multiple cladding layers formed on a GaAs temporary substrate 10 used for epitaxy is provided. The first layer is a GaInP epitaxial layer 11, and the second layer is n$^+$GaAs epitaxial layer 12. LED epitaxial layers 13 are formed on the n$^+$GaAs epitaxial layer 12. The LED epitaxial layers 13 has a p-n or n-p structure, and can be II–IV or III–V metals with the direct-bandgap, for example, ZnSe, AlGaInP or GaN.

Next, a buffer layer 21, a reflective layer 22 and a diffusion barrier 23 are formed between the conductive permanent substrate 20 and the LED epitaxial layers 13. The buffer layer 21, the reflective layer 22 and the diffusion barrier 23 can be arranged in an arbitrary order, and individually including one or more films. Particularly, the film placed between the reflective layer 22 and the LED epitaxial layers 13 must be transparent. These three layers can be preliminarily deposited on one or both of the LED epitaxial layers 13 and the permanent substrate 20, and finally be associated by wafer bonding. Three common embodiments are described as follows.

Figure 2A:
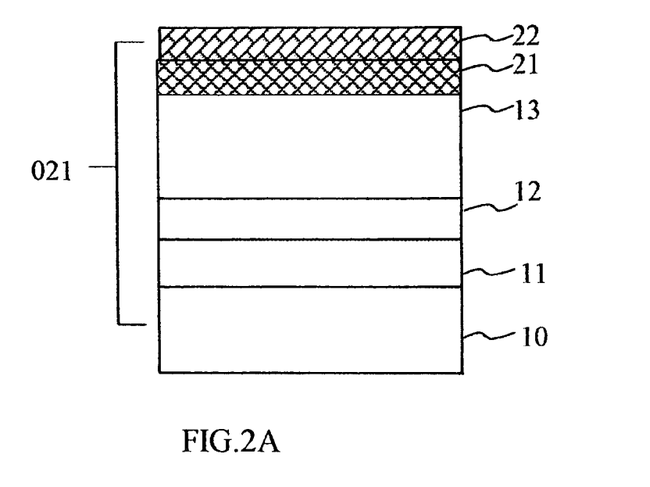
FIGS. 2A–2D show the process in accordance with the first embodiment of the present invention.
Figure 2B:
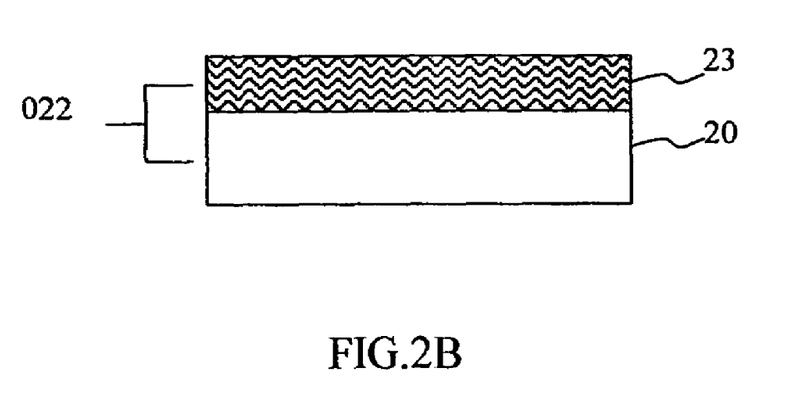
Figure 2C:
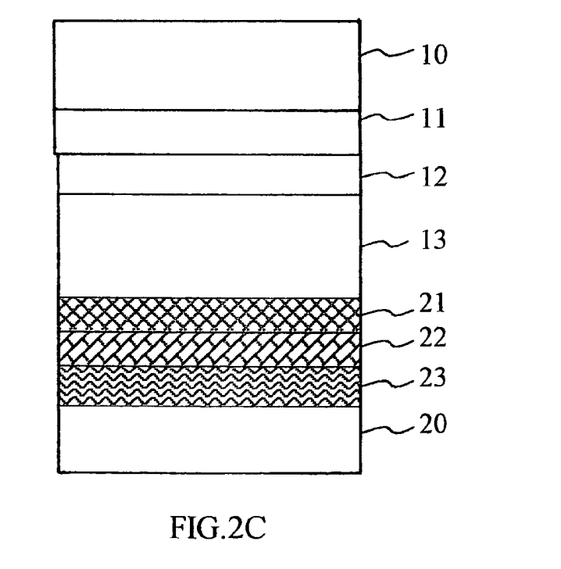
Figure 2D:
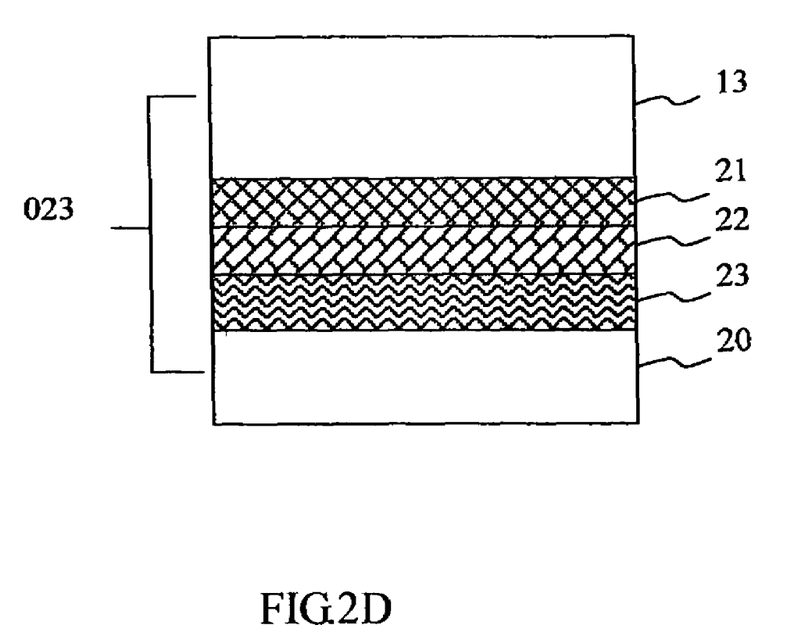

Referring to FIGS. 2A and 2B, the buffer layer 21 and the reflective layer 22 are sequentially deposited and coated on the LED epitaxial layers 13 to form a multi-layer structure 021, and the diffusion barrier 23 is deposited on the permanent substrate 20 to form another multi-layer structure 022. Then, the multi-layer structure 021 is flipped and bonded to another multi-layer structure 022, as shown in FIG. 2C. Next, the temporary substrate 10 and the first layer (GaInP epitaxial layer) 11 are removed by etching, and stopping at the n+GaAs epitaxial layer 12 to obtain an LED 023 with the reflective layer and the conductive substrate as shown in FIG. 2D. In this embodiment, the buffer layer 21, the reflective layer 22 and the diffusion barrier 23 can be formed by physical deposition, for example, sputtering, e-beam, and thermal deposition.

The buffer layer 21, the reflective layer 22 and the diffusion barrier 23 of this embodiment are all electrically conductive, and the one adjacent to the LED epitaxial layers or the permanent substrate must have property of ohmic contact. The buffer layer 21 can be made from conductive metal oxides, for example, $In_2O_3(Sn)$, $SnO_2(Sb)$, $SnO_2(F)$, $Zn_2O_3(Al)$, $ZnO(Al)$, $ZnO(In)$, $ZnO(Ga)$, $RuO_2$, $IrO_2$, $NiO$, $Bi_2O_3$, $MoO_3$, $Cd_2SnO_4$, $Cd_2SnO_3$, super conductive oxides, and mixture thereof. It should be also noted that the thermal expansion coefficient of the buffer layer 21 requires to be either larger than those of both the using-for-epitaxy temporary substrate 10 and the permanent substrate 20, or less than those of them both. In this embodiment, the using-for-epitaxy temporary substrate 10 is GaAs with a thermal expansion coefficient $5.7 \times 10^{-6}/K$, and the permanent substrate 20 is silicon with a thermal expansion coefficient $2.6 \times 10^{-6}$. That is, the buffer layer 21 has to have a thermal expansion coefficient larger than $5.7 \times 10^{-6}$ or less than $2.6 \times 10^{-6}$.

The reflective layer 22 in this embodiment is made from Au and Au—Be. Other material such as In, Sn, Al, Pt, Pd, Zn, Ag, Ge, Ni, Au—Zn, Au—Ge, Au—Ge—Ni, etc., or mixtures thereof with the function of reflection can be used, too.

The diffusion barrier 23 in this embodiment is made form Pt and Ti. Other material containing Ti, Ta, (Ti, Ta, W)—N, (Ti, Ta, W)—Si—N, (Ti, Ta, W)—B—N, and mixtures thereof with the function of diffusion barrier can be used, too.

Figure 3A:
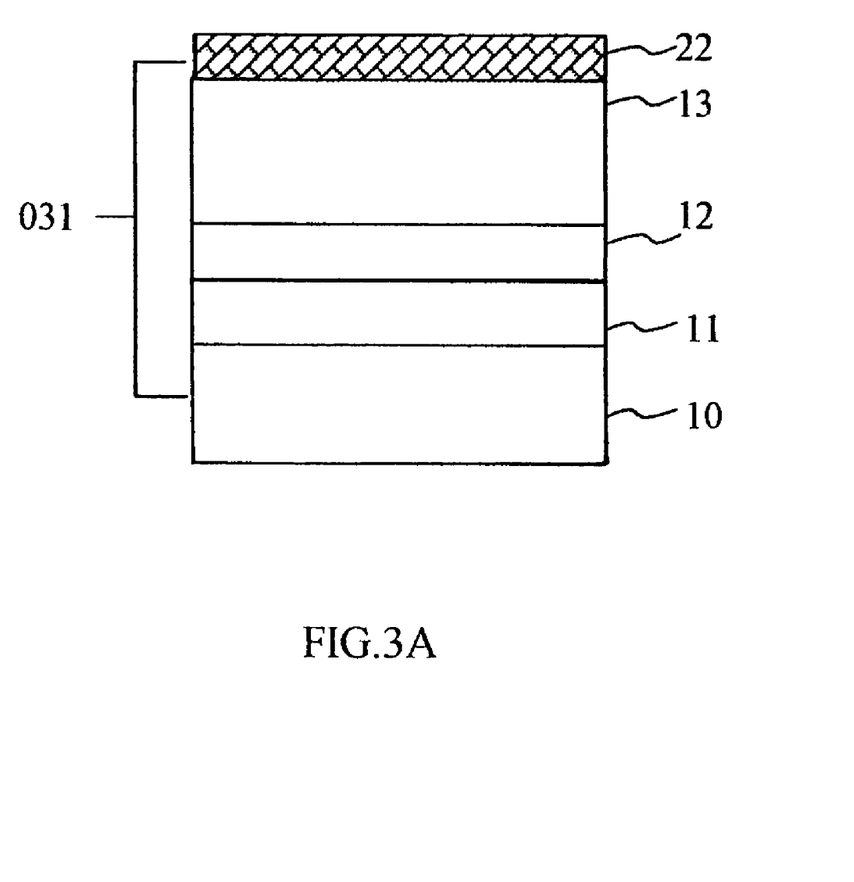
FIGS. 3A–3D show the process in accordance with the second embodiment of the present invention.
Figure 3B:
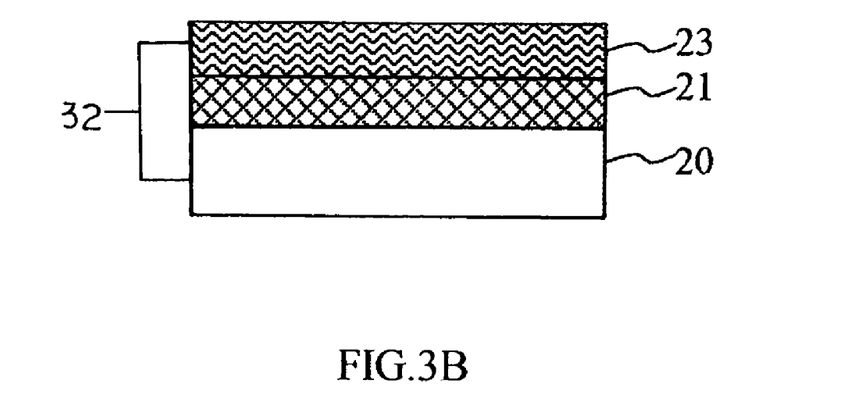
Figure 3C:
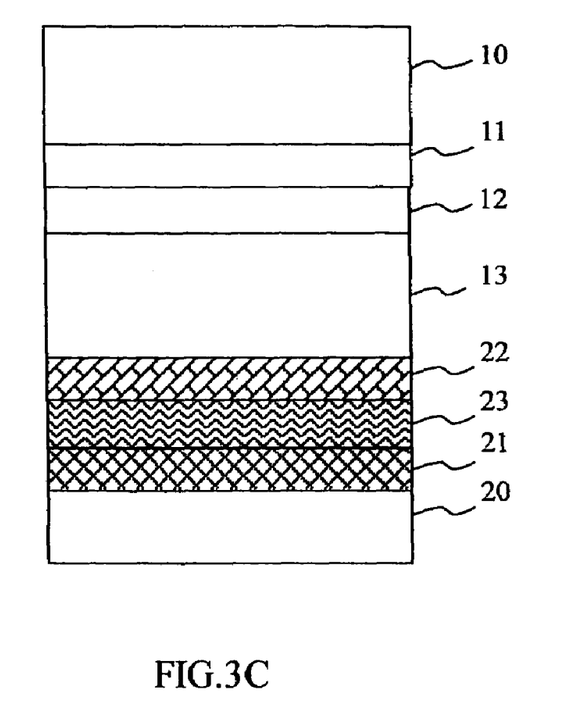
Figure 3D:
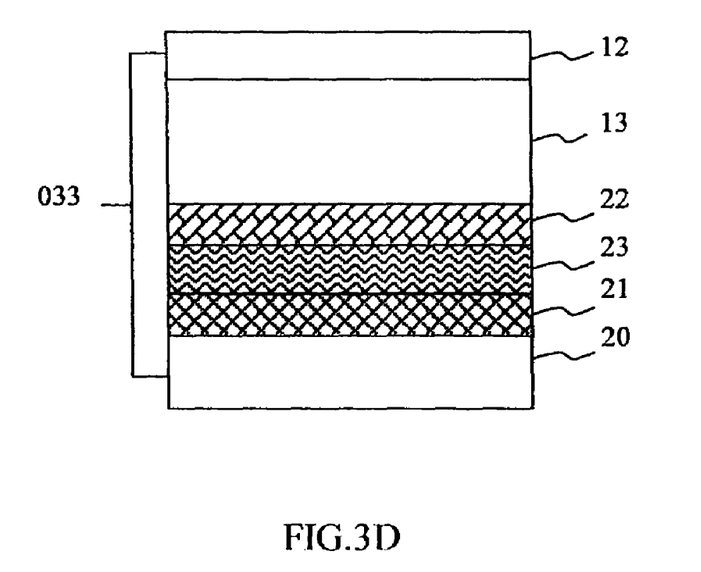

FIGS. 3A, 3B, 3C and 3D show the second embodiment in accordance with the present invention. The reflective layer 22 is coated on the LED epitaxial layers 13 to form a multi-layer structure 031, and the buffer layer 21 and the diffusion barrier 23 are sequentially deposited on the permanent substrate 20 to form another multi-layer structure 032. Then the multi-layer structure 031 is flipped and bonded to another multi-layer structure 032, as shown in FIG. 3C. Next, the temporary substrate 10 and the first layer (GaInP epitaxial layer) 11 are removed by etching, and stopping at the n+GaAs epitaxial layer 12 to obtain an LED 033 with the reflective layer and the conductive substrate as shown in FIG. 3D.

Figure 4A:
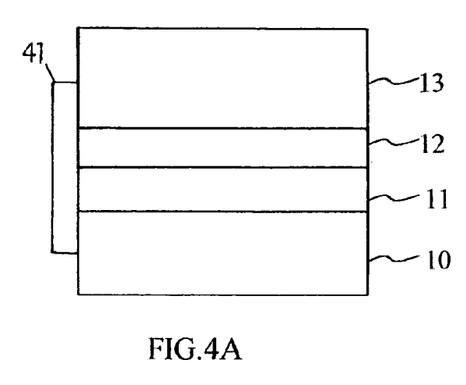
FIGS. 4A–4C show the process in accordance with the third embodiment of the present invention.
Figure 4B:
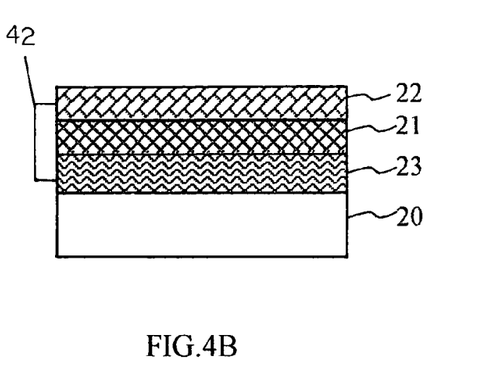
Figure 4C:
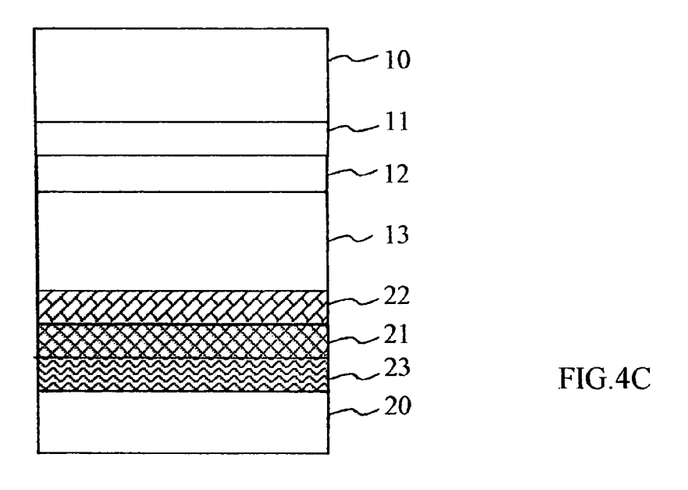

FIGS. 4A, 4B and 4C show another embodiment, in which the diffusion barrier 23, the buffer layer 21 and the reflective layer 22 are sequentially deposited and coated on the permanent substrate 20 to form a multi-layer structure 042. Then the multi-layer structure 041 including the temporary substrate 10 and the epitaxial layers 11, 12 and 13 is flipped, and bonded to the above multi-layer structure 042. Next, the temporary substrate 10 and the first layer (GaInP epitaxial layer) 11 are removed by etching, and stopping at the n+GaAs epitaxial layer 12 as shown in FIG. 4C.

Figure 5:
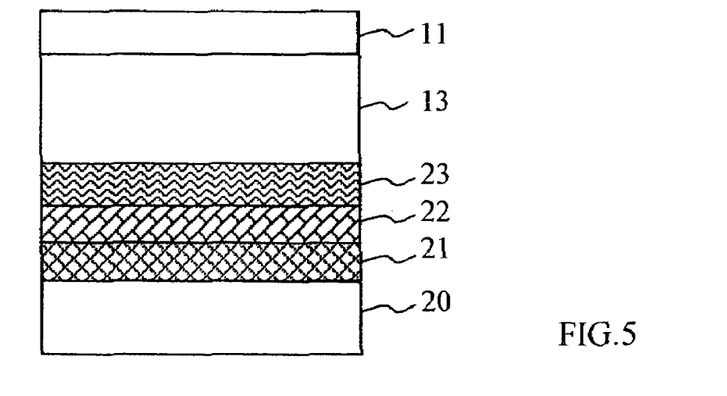
FIGS. 5–7 show the other three structures of the LED in accordance with the present invention.
Figure 6:
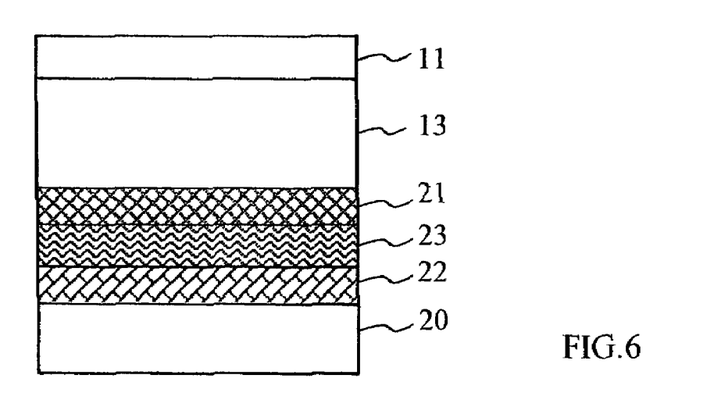
Figure 7:
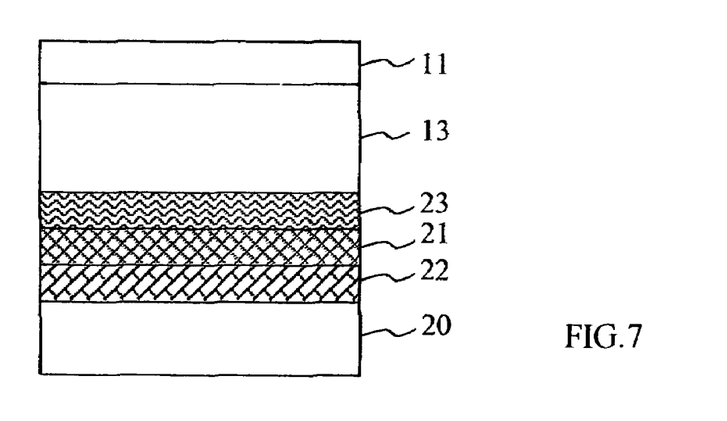

FIGS. 5–7 show different arrangement of the buffer layer 21, the reflective layer 22 and the diffusion barrier 23, wherein the technologies including physical deposition, wafer bonding, and etching are applied, too.

Figure 8A:
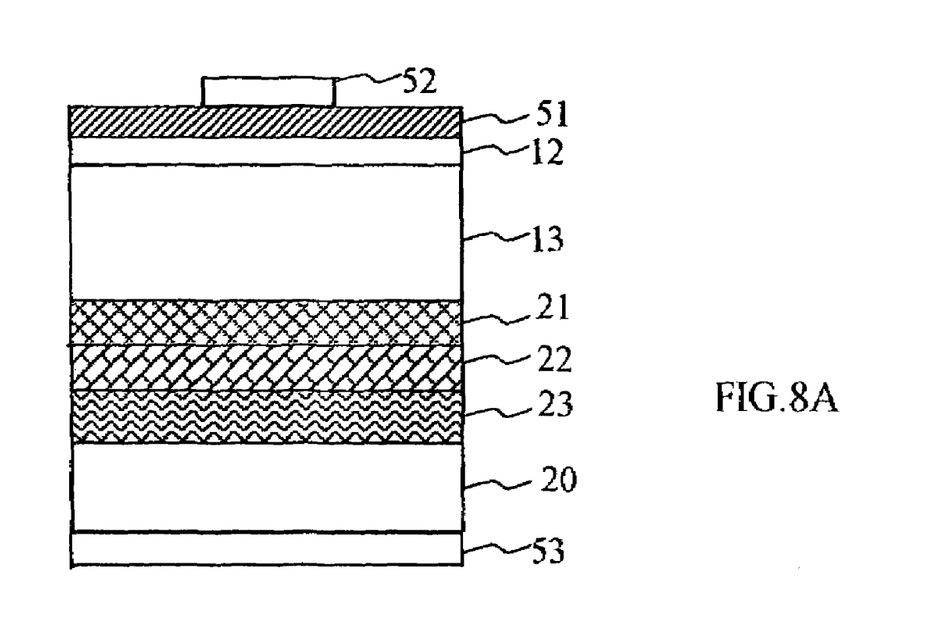
FIGS. 8A and 8B show different arrangements of the electrodes in accordance with the present invention.
Figure 8B:
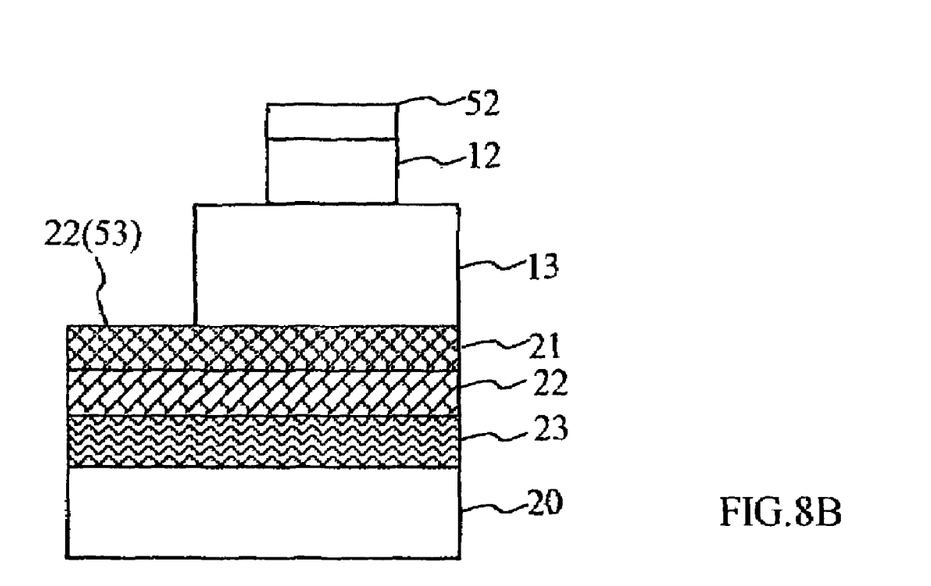

FIGS. 8A and 8B show two styles for forming electrodes. In FIG. 8A, a transparent electrode 51 is formed on the n+GaAs epitaxial layer 12, and then a first electrode 52 used for local wire bonding is formed on the transparent electrode 51. A second electrode 53 is formed on backside of the conductive permanent substrate 20. Certainly, the first electrode 52 can be directly formed on the n+GaAs epitaxial layer 12. The top surface of the first electrode 51 or the n+GaAs epitaxial layer 12 can be further shaped into a rough surface by dry etching so as to improve the refractive effect of the light source.

In FIG. 8B, most of the n+GaAs epitaxial layer 12 are etched, and the first electrode 52 is formed on the remained epitaxial layer 12. Next, the exposed LED epitaxial layers 13 are etched to expose partial reflective layer 22, on which the second electrode 53 is then formed. The second electrode can be also formed on backside of the permanent substrate 20.

According to the above embodiments, the LED of the present invention possesses the following advantages:
1. No damage occurs on the epitaxial layers during wafer bonding, since the wafers are all thick enough, and therefore the yield of mass product can be increased.
2. The GaAs temporary epitaxial layer can be selectively removed, which promotes the emitting efficiency of the LED.
3. The reflective layer facilitates light beams to emit from the front surface, which effectively increases brightness of the LED.
4. The buffer layer prevents the wafers from damage caused by different heat transfer coefficients and thermal expansion coefficients.
5. The diffusion barrier blocks the thermal diffusion of elements between layers during wafer bonding, so that characteristics and quality of the LED can be maintained.
6. The rough electrode surface may cause the light beams to be repeatedly refracted, and brightness of the LED can be enhanced.
7. The vertical LED (two electrodes are respectively arranged over the LED epitaxial layers and backside of the permanent substrate) may efficiently utilize the LED surfaces and increase productivity thereof.

What is claimed is:
1. A method for producing a high brightness LED, comprising steps of:
   a) providing a temporary substrate for epitaxy;
   b) forming LED epitaxial layers on said temporary substrate, wherein said LED epitaxial layers with pn junction;
   c) providing a permanent substrate;
   d) sequentially forming a buffer layer and a reflective layer on said LED epitaxial layers;
   e) forming a diffusion barrier on said permanent substrate;
   f) associating said LED epitaxial layers and said permanent substrate by wafer bonding technology; and
   g) forming a first electrode and a second electrode on proper position to supply enough energy for said LED epitaxial layers.
2. A method for producing a high brightness LED, comprising steps of:
   a) providing a temporary substrate for epitaxy;

b) forming LED epitaxial layers on said temporary substrate, wherein said LED epitaxial layers with pn junction;
c) providing a permanent substrate;
d) forming a reflective layer on said LED epitaxial layers;
e) sequentially forming a buffer layer and a diffusion barrier on said permanent substrate;
f) associating said LED epitaxial layers and said permanent substrate by wafer bonding technology; and
g) forming a first electrode and a second electrode on proper position to supply enough energy for said LED epitaxial layers.

3. A method for producing a high brightness LED, comprising steps of:

a) providing a temporary substrate for epitaxy;
b) forming LED epitaxial layers on said temporary substrate, wherein said LED epitaxial layers with pn junction;
c) providing a permanent substrate;
d) sequentially forming a diffusion barrier, a buffer layer and a reflective layer on said permanent substrate;
e) associating said LED epitaxial layers and said permanent substrate by wafer bonding technology; and
f) forming a first electrode and a second electrode on proper position to supply enough energy for said LED epitaxial layers.

* * * * *